(12) United States Patent
Hara et al.

(10) Patent No.: US 11,862,488 B2
(45) Date of Patent: Jan. 2, 2024

(54) SUBSTRATE STAGE

(71) Applicant: Tokyo Electron Limited, Tokyo (JP)

(72) Inventors: Masamichi Hara, Yamanashi (JP); Yasuyuki Kagaya, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 91 days.

(21) Appl. No.: 16/842,219

(22) Filed: Apr. 7, 2020

(65) Prior Publication Data

US 2020/0335365 A1 Oct. 22, 2020

(30) Foreign Application Priority Data

Apr. 19, 2019 (JP) ................................. 2019-079909

(51) Int. Cl.
*H01L 21/67* (2006.01)
*H01L 21/683* (2006.01)

(52) U.S. Cl.
CPC .... *H01L 21/67103* (2013.01); *H01L 21/6833* (2013.01)

(58) Field of Classification Search
CPC ......... H01L 21/67103; H01L 21/67248; H01L 21/6831; H01L 21/6833; H01L 21/6875
USPC ............................................. 219/443.1–468.2
See application file for complete search history.

(56) References Cited

U.S. PATENT DOCUMENTS

| | | | |
|---|---|---|---|
| 5,167,723 A * | 12/1992 | Tsukakoshi | H05K 3/281 136/227 |
| 5,761,023 A | 6/1998 | Lue et al. | |
| 6,191,394 B1 * | 2/2001 | Shirakawa | H01L 21/67248 118/724 |
| 6,229,116 B1 * | 5/2001 | Shirakawa | H01L 21/67248 219/390 |
| 6,960,743 B2 * | 11/2005 | Hiramatsu | H05B 3/141 219/444.1 |
| 2002/0036881 A1 * | 3/2002 | Shamouilian | C04B 35/185 361/234 |
| 2003/0121906 A1 * | 7/2003 | Abbott | C23C 4/123 219/543 |
| 2011/0277803 A1 * | 11/2011 | Grande | G01K 13/20 136/225 |
| 2012/0299253 A1 * | 11/2012 | Kosakai | H01L 21/67103 279/128 |

FOREIGN PATENT DOCUMENTS

| | | |
|---|---|---|
| JP | H03-010130 A | 1/1991 |
| JP | H11-211576 A | 9/1999 |
| JP | H11-251038 A | 9/1999 |
| JP | 2000-31152 A | 1/2000 |
| JP | 2000-236015 A | 8/2000 |
| JP | 2004-282047 A | 10/2004 |
| JP | 2007-088411 A | 4/2007 |
| JP | 2012-069947 A | 4/2012 |
| JP | 2017-524135 A | 8/2017 |

* cited by examiner

*Primary Examiner* — Sang Y Paik
(74) *Attorney, Agent, or Firm* — Venjuris, P.C.

(57) ABSTRACT

A substrate stage includes: a stage body having a substrate placing surface on which a substrate is placed in a processing apparatus that performs a processing on the substrate; and a thermocouple configured to detect a temperature near the substrate placing surface of the stage body. The thermocouple includes a temperature measuring unit formed by stacking a first metal film and a second metal film, on a surface on a side of the substrate placing surface of the stage body.

20 Claims, 4 Drawing Sheets

US 11,862,488 B2

SUBSTRATE STAGE

CROSS-REFERENCE TO RELATED APPLICATIONS

This application is based on and claims priority from Japanese Patent Application No. 2019-079909 filed on Apr. 19, 2019 with the Japan Patent Office, the disclosure of which is incorporated herein in its entirety by reference.

TECHNICAL FIELD

The present disclosure relates to a substrate stage.

BACKGROUND

In a manufacturing processing of a semiconductor device or the like, a semiconductor wafer serving as a substrate is placed on a substrate stage in a processing container, and various processings such as a CVD film formation and an etching are performed on the target substrate while introducing a predetermined gas into the processing container.

A substrate stage is known to include, for example, a body provided with a heater configured to heat a target substrate or an electrode configured to electrostically adsorb the target substrate, and a thermocouple serving as a temperature sensor that is inserted into a hole provided from below the body to an intermediate portion thereof (see, e.g., Japanese Patent Laid-Open Publication No. 11-251038).

SUMMARY

A substrate stage according to an aspect of the present disclosure includes a substrate placing surface on which a substrate is placed in a processing apparatus that performs a processing on the substrate, having a stage body; and a thermocouple configured to detect a temperature near the substrate placing surface of the stage body. The thermocouple includes a temperature measuring unit formed by stacking a first metal film and a second metal film, on a surface on the substrate placing surface side of the stage body.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of the present disclosure will be described with reference to the drawings.

First Embodiment

First, a first embodiment will be described.

Figure 1:
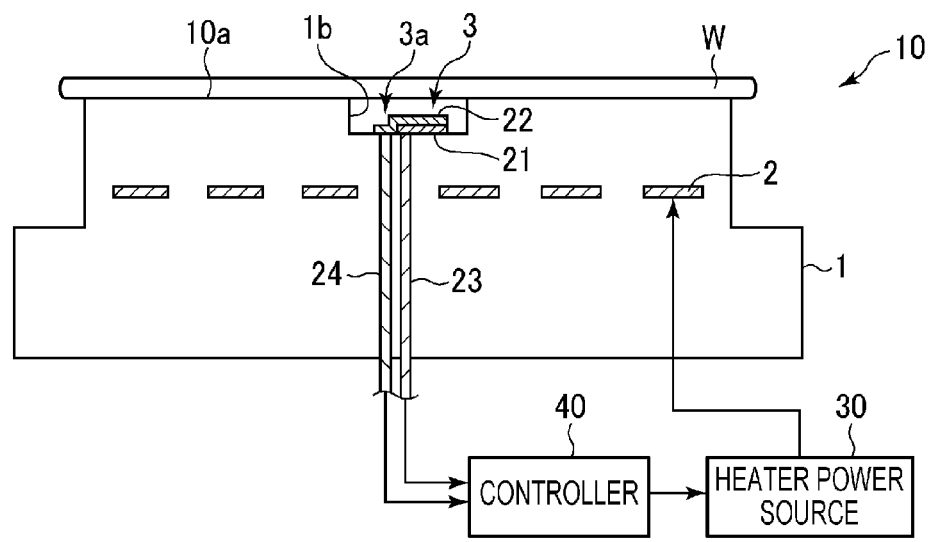
FIG. 1 is a cross-sectional view illustrating an example of a substrate stage according to a first embodiment.
Figure 2:
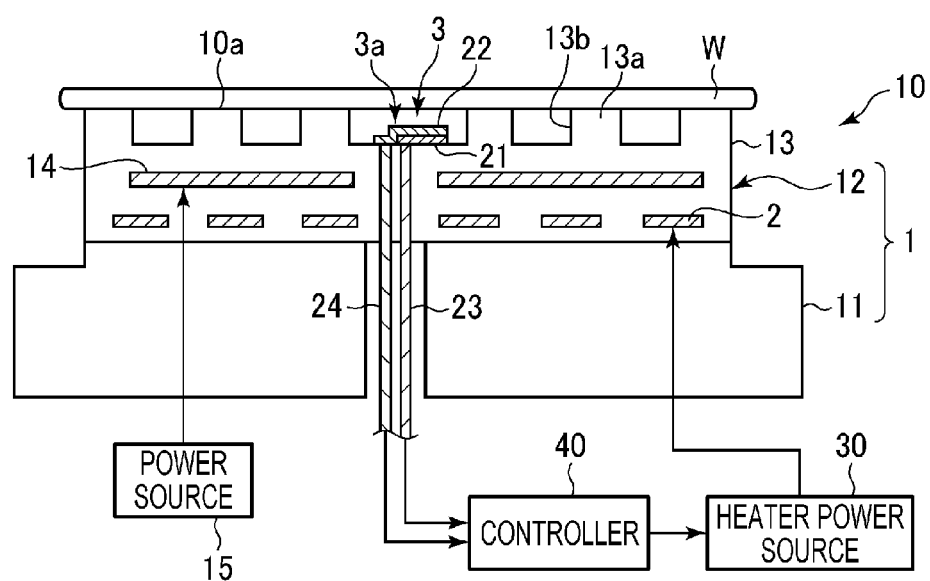
FIG. 2 is a cross-sectional view illustrating another example of the substrate stage according to the first embodiment.

FIG. 1 is a cross-sectional view illustrating an example of a substrate stage according to the first embodiment, and FIG. 2 is a cross-sectional view illustrating another example of the substrate stage according to the first embodiment. The first embodiment is a basic embodiment.

In the present embodiment, a substrate stage 10 is provided in a processing container of a processing apparatus in which a processing (e.g., a film forming processing) is performed on a substrate W (e.g., a semiconductor wafer). The substrate stage 10 has a substrate placing surface 10a on which the substrate W is placed. The substrate stage 10 has a stage body 1 and a thermocouple 3 that detects a temperature near the substrate placing surface 10a of the stage body 1. Further, heaters 2 are provided in the stage body 1. Then, the substrate W is placed on the substrate placing surface 10a, and a processing (e.g., a CVD film forming processing) is performed on the substrate W in a state where the inside of the processing container is maintained in a vacuum.

The stage body 1 may be entirely made of a metal or a ceramic bulk material, or as illustrated in FIG. 2, may have an electrostatic chuck 12 that adsorbs the substrate W on a base substrate 11 including a bulk material. The electrostatic chuck 12 is formed by providing an electrode 14 in a dielectric body 13 such as alumina. As illustrated, a surface of the electrostatic chuck 12 may be an embossed surface having a plurality of protrusions 13a. In this case, the surface of the protrusion 13a serves as the substrate placing surface 10a. The electrode 14 is connected with an electrostatic adsorption power source (a DC power source) 15. The electrostatic chuck 12 may be a bulk material, or may be formed by thermal spraying.

A heater 2 functions as a temperature adjuster, and during a processing performed in a substrate apparatus, for example, in a case of a CVD film formation, heats the stage body 1 to heat the substrate W to a processing temperature. A mechanism which allows a temperature adjusting medium to flow through the stage body 1 may be used as a temperature adjuster depending on processings, instead of the heater 2.

The thermocouple 3 has a temperature measuring unit 3a formed on the surface on the substrate placing surface 10a side of the stage body 1 in a state where a first metal film 21 and a second metal film 22 are stacked. In the temperature measuring unit 3a, the first metal film 21 and the second metal film 22 are brought into contact with each other to form a circuit, and a thermo-electromotive force is generated. Therefore, the temperature of a portion near the substrate placing surface 10a of the stage body 1 is detected. In the example in FIG. 1, the temperature measuring unit 3a is formed on the surface of a recess 1b formed on the substrate placing surface 10a side of the stage body 1, and a space is provided between the temperature measuring unit 3a and the substrate W. Further, in the example in FIG. 2, the temperature measuring unit 3a is formed on the surface of a recess 13b formed between the protrusions 13a, and a space is provided between the temperature measuring unit 3a and the substrate W. A thin insulating film may be provided between the temperature measuring unit 3a and the substrate W.

The thickness of the first metal film 21 and the second metal film 22 is about 0.1 μm to 100 μm, and may be formed by a film forming technique such as thermal spraying, CVD, PVD, and plating. Among them, thermal spraying may be used. Examples of a combination of the first metal film 21 and the second metal film 22 may include chromel and alumel. Additionally, a combination of materials used as a thermocouple in the related art, such as a combination of platinum-rhodium alloy and platinum, and iron and constantan may be adopted.

The thermocouple 3 includes compensating lead wires 23 and 24 connected to the first metal film 21 and the second metal film 22, and extending vertically downward in the stage body 1. The compensating lead wires 23 and 24 may be made of the same material as the first metal film 21 and the second metal film 22, respectively, but may be made of a different material such as copper or tungsten. The compensating lead wires 23 and 24 are connected to a controller 40 (to be described later).

The heater is supplied with power from a heater power source 30. The controller 40 controls the output of the heater power source 30 based on a signal from the thermocouple 3, such that the temperature of the substrate placing surface 10a of the substrate stage 10 becomes a predetermined temperature.

In the substrate stage 10 configured as described above, the substrate W transferred into the processing container by a transfer mechanism (not illustrated) outside the processing container is placed on the substrate placing surface 10a. When providing the electrostatic chuck 12, a DC voltage is applied to the electrode 14 to electrostatically adsorb the substrate W. At this time, the output from the heater power source 30 is controlled by the controller 40 based on a detection signal of the temperature measuring unit 3a of the thermocouple 3 including the first metal film 21 and the second metal film 22, so that the temperature near the substrate placing surface 10a of the stage body 1 is controlled. Further, the inside of the processing container is controlled to a predetermined vacuum pressure. In this state, a predetermined processing (e.g., a CVD film forming processing) is performed on the substrate W.

Figure 3:
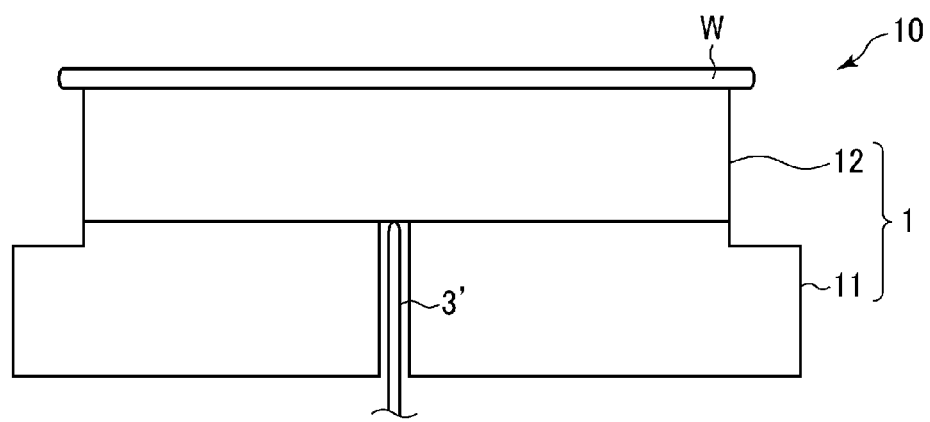
FIG. 3 is a schematic view for explaining a placing of a thermocouple on a substrate stage having an electrostatic chuck in the related art.

In the related art, the temperature of the substrate stage has been measured by inserting a sheath thermocouple, configured by inserting a thermocouple wire into a metal tube, into a thermocouple insertion hole formed in the stage body. In this case, it is not always possible to insert the thermocouple near the substrate placing surface, and the temperature at the position where the temperature measuring unit of the thermocouple exists is lower than that of the substrate placing surface, and thus, the thermal responsiveness was not sufficient. As a result, it was difficult to control the temperature of the substrate placing surface with high accuracy. Particularly, when there is an electrostatic chuck, as illustrated in FIG. 3, a sheath thermocouple 3' is inserted only to a position below the electrostatic chuck 12, as in Japanese Patent Laid-Open Publication No. 11-251038. When the electrostatic chuck 12 is formed by thermal spraying, vacuum leakage occurs when drilling a hole, and it is physically difficult insert a thermocouple to the surface of the stage body 1.

With regard to this aspect, according to the present embodiment, the temperature measuring unit 3a of the thermocouple 3 is formed by stacking the first metal film 21 and the second metal film 22 on the surface on the substrate placing surface 10a of the stage body 1. As a result, it is possible to dispose the temperature measuring unit 3a at a position close to the substrate placing surface 10a of the stage body 1. Therefore, because of good responsiveness, it is possible to control the temperature of the substrate placing surface with high accuracy, and to control also the temperature of the substrate W with high accuracy. The present embodiment has a remarkable effect, particularly when there is a thermal sprayed electrostatic chuck into which a sheath thermocouple is not able to be inserted.

Further, in the present embodiment, since the first metal film 21 and the second metal film 22 are not in point-contact or line-contact as in a thermocouple in the related art, but in surface-contact, it is also advantageous in that the temperature near the substrate placing surface of the substrate stage 10 may be reliably measured.

Second Embodiment

Subsequently, a second embodiment will be described.

Figure 4:
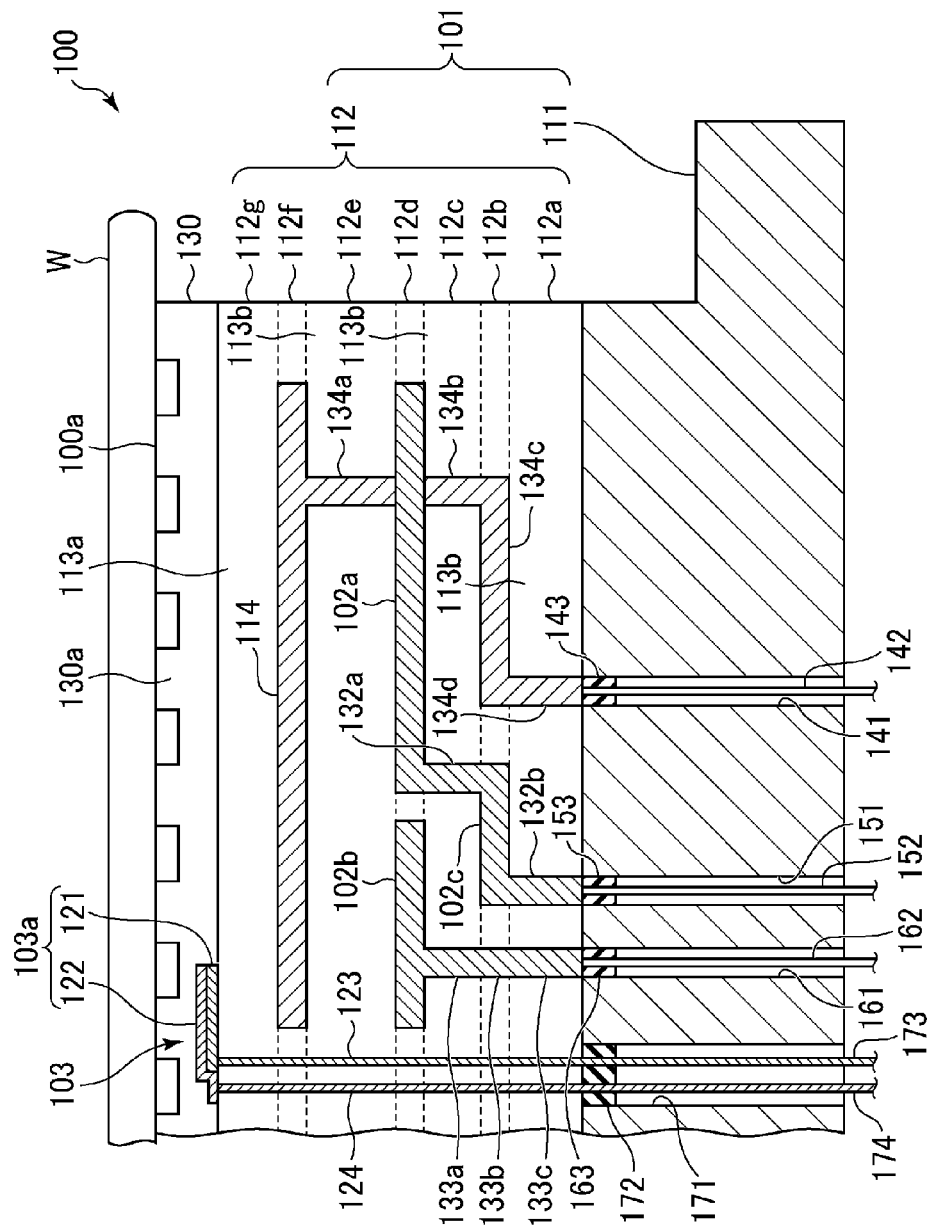
FIG. 4 is a cross-sectional view illustrating an example of a substrate stage according to a second embodiment.

FIG. 4 is a cross-sectional view illustrating an example of a substrate stage according to a second embodiment. The second embodiment is a more specific embodiment.

In the present embodiment, a substrate stage 100 is provided in a processing container of a processing apparatus in which a processing (e.g., a film forming processing) is performed on a substrate W (e.g., a semiconductor wafer). The substrate stage 100 has a substrate placing surface 100a on which the substrate W is placed. The substrate stage 100 has a stage body 101 and a thermocouple 103 that detects a temperature near the substrate placing surface 100a of the stage body 101. Then, the substrate W is placed on the substrate placing surface 100a, and a processing (e.g., a CVD film forming processing) is performed on the substrate W in a state where the inside of the processing container is maintained in a vacuum.

The stage body 101 includes a base substrate 111 including a metal such as aluminum or titanium or a ceramic bulk material, and an electrostatic chuck 112 formed thereon by thermal spraying.

The thermocouple 103 has a temperature measuring unit 103a formed on the surface on the substrate placing surface side of the stage body 101, that is the surface of the electrostatic chuck 112 in a state where a first metal film 121 and a second metal film 122 are stacked. In the temperature measuring unit 103a, the first metal film 121 and the second metal film 122 are brought into contact with each other to form a circuit, and a thermo-electromotive force is generated. Therefore, the temperature of a portion near the substrate placing surface 100a of the stage body 101 is detected.

Figure 5:
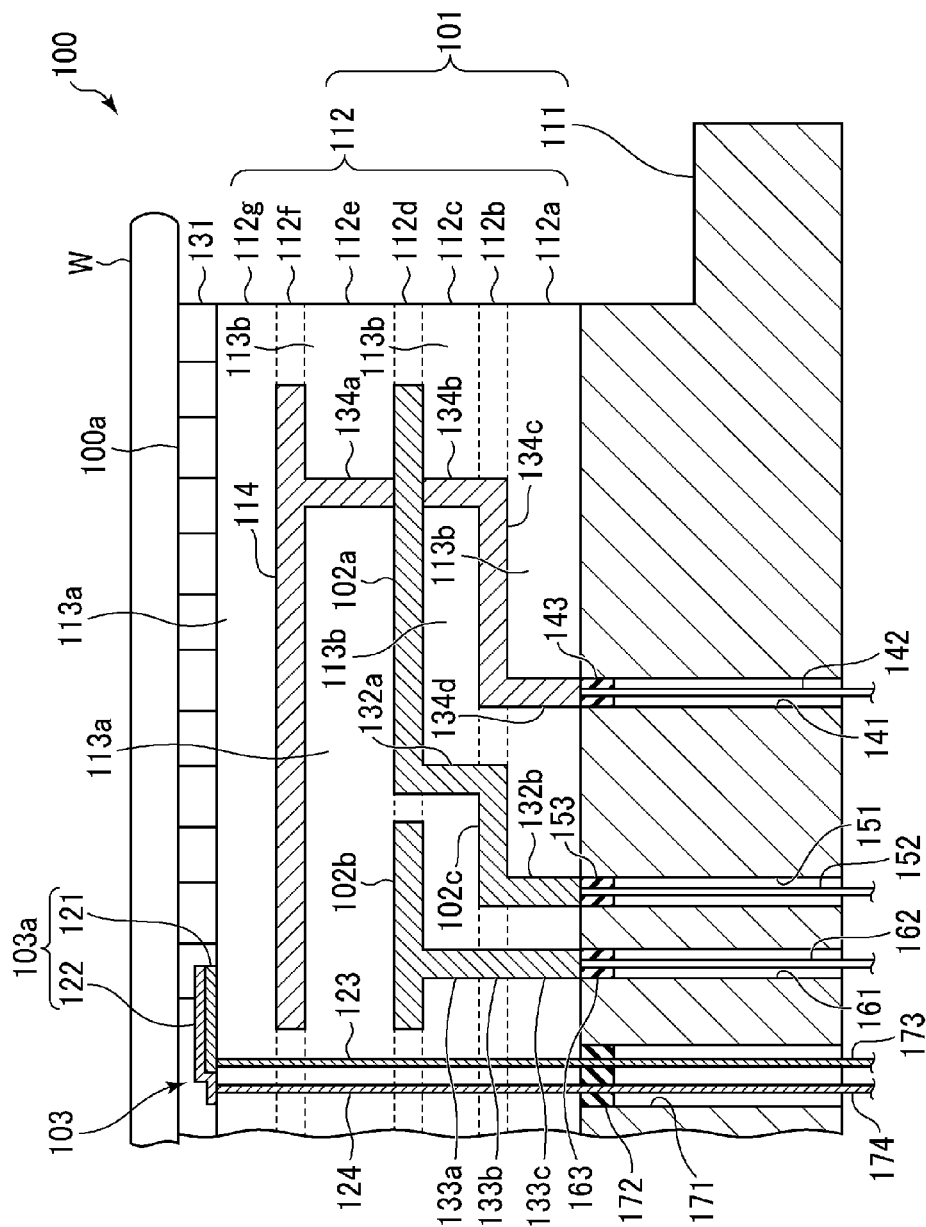
FIG. 5 is a cross-sectional view illustrating another example of the substrate stage according to the second embodiment.

On the surface of the electrostatic chuck 112, a thin insulating film 130 having a thickness of about 10 μm to 1,000 μm including an insulating ceramic such as alumina is formed by thermal spraying so as to cover the temperature measuring unit 103a of the thermocouple 103 including the first metal film 121 and the second metal film 122. A plurality of protrusions 130a having a height of about 10 μm to 100 μm is formed on a surface of the insulating film 130, and a surface of the protrusions 130a serves as the surface placing surface 100a. The protrusion 130a may be formed by embossing the insulating film 130, or may be formed of diamond-like carbon, TiN, or the like on the insulating film 130. Further, as illustrated in FIG. 5, a plurality of protrusions 131 having a height of about 0.1 μm to 100 μm may be formed of diamond-like carbon, TiN, or the like, directly on a portion of the electrostatic chuck 112 other than the temperature measuring unit 103a, and a space may be provided between the temperature measuring unit 103 of the thermocouple 103 and the substrate W. In this case, the surface of the protrusion 131 serves as the substrate placing surface 100a. Further, a thin insulating film up to a position lower than the protrusion 131 may be formed on the surface of the temperature measuring unit 103a.

The thickness of the first metal film 121 and the second metal film 122 is about 0.1 µm to 100 µm, and may be formed by a film forming technique such as thermal spraying, CVD, PVD, and plating. Among them, thermal spraying may be used. Examples of a combination of the first metal film 121 and the second metal film 122 may include chromel and alumel. Additionally, a combination of materials used as a thermocouple in the related art, such as a combination of platinum-rhodium alloy and platinum, and iron and constantan may be adopted.

The thermocouple 103 includes compensating lead wires 123 and 124 connected to the first metal film 121 and the second metal film 122, and extending vertically downward in the electrostatic chuck 112. The compensating lead wires 123 and 124 may be made of the same material as the first metal film 121 and the second metal film 122, respectively, but may be made of a different material such as copper or tungsten.

The electrostatic chuck 112 includes a plurality of thermal sprayed layers (thermal sprayed coatings). Specifically, the electrostatic chuck 112 includes a first thermal sprayed layer 112a, a second thermal sprayed layer 112b, a third thermal sprayed layer 112c, a fourth thermal sprayed layer 112d, a fifth thermal sprayed layer 112e, a sixth thermal sprayed layer 112f, and a seventh thermal sprayed layer 112g, from the base substrate 111. The total thickness of the electrostatic chuck 112 is about 5 mm to 20 mm.

The seventh thermal sprayed layer 112g, which is an uppermost layer, is a dielectric layer 113a for implementing electrostatic adsorption, and is made of, for example, an insulating ceramic such as alumina $Al_2O_3$. The sixth thermal sprayed layer 112f under the seventh thermal sprayed layer 112g has an electrostatic adsorption electrode layer 114 containing, for example, tungsten. The fifth thermal sprayed layer 112e under the sixth thermal sprayed layer 112f is mainly formed of an insulating layer 113b containing, for example, an insulating ceramic such as alumina. The fourth thermal sprayed layer 112d under the fifth thermal sprayed layer 112e has a main heater layer 102a and an inner heater layer 102b containing tungsten. The third thermal sprayed layer 112c under the fourth thermal sprayed layer 112d is mainly formed of an insulating layer 113b containing, for example, an insulating ceramic such as alumina. The second thermal sprayed layer 112b under the third thermal sprayed layer 112c has a heater layer 102c containing tungsten. The first thermal sprayed layer 112a, which is a lowermost layer, is formed of the insulating layer 113b containing, for example, an insulating ceramic such as alumina.

A first electrode wiring layer 134a connected to the electrode layer 114 and extending vertically downward is formed in the fifth thermal sprayed layer 112e. Further, a second electrode wiring layer 134b connected to the first electrode wiring layer 134a and extending vertically downward, a first heater wiring layer 132a extending vertically downward from the main heater layer 102a, and a first inner heater wiring layer 133a extending vertically downward from the inner heater layer 102b are formed in the third thermal sprayed layer 112c. In addition to the heater layer 102c, a third electrode wiring layer 134c that has one end connected to the second electrode wiring layer 134b and is extending horizontally, and a second inner heater wiring layer 133b connected to the first inner heater wiring layer 133a and extending vertically downward are formed in the second thermal sprayed layer 112b. A fourth electrode wiring layer 134d, a second heater wiring layer 132b, and a third inner heater wiring layer 133c are formed in the first thermal sprayed layer 112a. The fourth electrode wiring layer 134d is connected to the other end of the third electrode wiring layer 134c, and extends vertically downward. The second heater wiring layer 132b is connected to the heater layer 102c, and extends vertically downward. The third inner heater wiring layer 133c is connected to the second inner heater wiring layer 133b, and extends vertically downward. The electrode wiring layers and the heater wiring layers are formed of the same material as those of the electrodes and heaters, for example, tungsten.

The compensating lead wires 123 and 124 of the thermocouple 103 are provided in the thermal first sprayed layer 112a, the second thermal sprayed layer 112b, the third thermal sprayed layer 112c, the fourth thermal sprayed layer 112d, the fifth thermal sprayed layer 112e, the sixth thermal sprayed layer 112f, and the seventh thermal sprayed layer 112g. The compensating lead wires 123 and 124 in the thermal sprayed layers may be formed by thermal spraying at the time of thermal spraying of each layer. Alternatively, each layer may be thermally sprayed in a state where the compensating lead wires 123 and 124 are rod-shaped and set vertically.

The remaining portions of the second thermal sprayed layer 112b, the fourth thermal sprayed layer 112d, and the sixth thermal sprayed layer 112f are the insulating layers 113b containing, for example, insulating ceramic such as alumina.

When forming each of the thermal sprayed layers, for example, an insulating layer is formed by thermal spraying of, for example, alumina, and etching is performed thereon, and then thermal spraying of an electrode, a heater, a wiring, or the like is performed on the etched portion using a mask.

A through hole 141 is formed in the base substrate at a position corresponding to the fourth electrode wiring layer 134d in the first thermal sprayed layer 112a, and an electrode wiring 142 connected to the fourth electrode wiring layer 134d is drawn to the outside through the through hole 141. A connecting portion between the fourth electrode wiring layer 134d and the electrode wiring 142 is sealed by a sealing portion 143 made of resin or the line, and thus, leakage is prevented.

Further, through holes 151 and 161 are respectively formed in the base substrate 111 at positions corresponding to the second heater wiring layer 132b and the third inner heater wiring layer 133c in the first thermal sprayed layer 112a. Heater wirings 152 and 162 are respectively connected to the second heater wiring layer 132b and the third inner heater wiring layer 133c, and the heater wirings 152 and 162 are respectively drawn to the outside through the through holes 151 and 161. A connecting portion between the second heater wiring layer 132b and the heater wiring 152, and a connecting portion between the third inner heater wiring layer 133c and the heater wiring 162 are respectively sealed by sealing portions 153 and 163 of resin or the like, and thus, leakage is prevented.

A through hole 171 is formed in the base substrate 111 at a position corresponding to the compensating lead wires 123 and 124 in the electrostatic chuck 112. Compensating lead wires 173 and 174, which are components of the thermocouple 103, respectively, are connected to the compensating lead wires 123 and 124 in the electrostatic chuck 112, and the compensating lead wires 173 and 174 are drawn to the outside through the through hole 171. Connecting portions between the compensating lead wires 123 and 124 in the electrostatic chuck 112 and the compensating lead wires 173 and 174 are sealed by a sealing portion 172 made of resin or the line, and thus, leakage is prevented.

The electrode wiring 142 is connected to the electrostatic adsorption power source. Further, the heater wiring 152 is connected to the heater power source. The compensating lead wires 173 and 174 are connected to the controller (neither is shown in FIG. 4; see FIGS. 1 and 2).

Similarly to the first embodiment, power is supplied from a heater power source to the main heater layer 102*a*, the inner heater layer 102*b*, and the heater layer 102*c*. A controller controls the output of the heater power source based on a signal from the thermocouple 103 such that the temperature of the substrate placing surface 100*a* of the stage body 101 becomes a predetermined temperature.

In the substrate stage 100 configured as described above, the substrate W transferred into the processing container by a transfer mechanism (not illustrated) outside the processing container is placed on the substrate placing surface 100*a*. Then, a DC voltage is applied to the electrode 114 of the electrostatic chuck 112 to electrostatically adsorb the substrate W. At this time, the output from the heater power source is controlled by the controller based on a detection signal of the temperature measuring unit 103*a* of the thermocouple 103 including the first metal film 121 and the second metal film 122, so that the temperature near the substrate placing surface 100*a* of the stage body 101 is controlled. Further, the inside of the processing container is controlled to a predetermined vacuum pressure. In this state, a predetermined processing, for example, a CVD film forming processing is performed on the substrate W.

Also in the present embodiment, the temperature measuring unit 103*a* of the thermocouple 103 is formed by stacking the first metal film 121 and the second metal film 122 on the surface on the substrate placing surface 100*a* of the stage body 101. As a result, it is possible to dispose the temperature measuring unit 103*a* at a position close to the substrate placing surface 100*a* of the stage body 101. Therefore, because of good responsiveness, it is possible to control the temperature of the substrate placing surface with high accuracy, and to control also the temperature of the substrate W with high accuracy.

Further, since it is possible to form the compensating lead wires 123 and 124 connected to the first metal film 121 and the second metal film 122 in the electrostatic chuck 112 without drilling a hole in the electrostatic chuck 112 formed by thermal spraying, a problem of vacuum leakage does not occur.

Also in the present embodiment, similarly to the first embodiment, since the first metal film 121 and the second metal film 122 are in surface-contact, it is advantageous in that the temperature near the substrate placing surface of the substrate stage 100 may be reliably measured.

For example, in the embodiment, the substrate stage having a specific shape is described, but the shape of the substrate stage is not limited thereto. Further, a film forming processing, particularly a CVD film forming processing is described as an example of the applied processing. However, the present disclosure is not limited thereto, and may be applied to another processing such as a PVD film forming processing or an etching processing.

According to the present disclosure, a substrate stage capable of controlling a temperature of the substrate placing surface with high accuracy is provided.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate stage comprising:
   a stage body having a substrate placing surface on which a substrate is placed in a processing apparatus that performs a processing on the substrate; and
   a thermocouple configured to detect a temperature near the substrate placing surface of the stage body,
   wherein the thermocouple includes a temperature gauge formed by stacking a first metal film and a second metal film on a surface on a side of the substrate placing surface of the stage body,
   the stage body includes a plurality of protrusions defining a recess of the stage body,
   the temperature gauge is disposed between the plurality of protrusions in the recess of the stage body,
   the first metal film is in contact with a bottom surface of the recess of the stage body,
   an upper surface of the second metal film on the first metal film is disposed lower than an upper surface of the plurality of protrusions defining the recess of the stage body thereby providing a space between the upper surface of the second metal film and the substrate when the substrate is disposed on the substrate placing surface, and
   a contact surface between the substate and the plurality of protrusions is larger than a non-contact surface between the substate and the plurality of protrusions in a plan view when the substrate is disposed on the substrate placing surface.

2. The substrate stage according to claim 1, wherein the first metal film and the second metal film are formed by thermal spraying.

3. The substrate stage according to claim 1, further comprising:
   a temperature controller provided in the stage body,
   wherein the substrate stage controls the temperature controller based on a detection signal of the thermocouple.

4. The substrate stage according to claim 3, wherein the temperature controller includes a heater configured to heat the stage body.

5. The substrate stage according to claim 1, wherein the recess is formed on the surface of the stage body, and the first metal film and the second metal film are formed in the recess.

6. The substrate stage according to claim 5, wherein the first and second metal films of the temperature gauge are surrounded by the recess of the stage body and the substrate.

7. The substrate stage according to claim 1, wherein the plurality of protrusions is formed on the surface of the stage body, and the first metal film and the second metal film are formed in a recess formed between the plurality of protrusions.

8. The substrate stage according to claim 1, wherein the stage body includes a base substrate, and an electrostatic chuck formed on the base substrate to electrostatically adsorb the substrate.

9. The substrate stage according to claim 8, wherein the electrostatic chuck is formed by thermal spraying, and a compensating lead wire connected to the first metal film and the second metal film of the thermocouple is formed in the electrostatic chuck.

10. The substrate stage according to claim 9, wherein the compensating lead wire is formed by thermal spraying.

11. The substrate stage according to claim 1, wherein the first metal film is made of chromel, and the second metal film is made of alumel.

12. The substrate stage according to claim 1, wherein the substrate directly covers the recess of the stage body such that the substrate is in contact with the plurality of protrusions defining the recess of the stage body,
the plurality of protrusions further defines the substrate placing surface of the stage body, and the substrate is in contact with the substrate placing surface of the plurality of protrusions.

13. The substrate stage according to claim 1, wherein the temperature gauge is surrounded by the stage body and the substrate, the substrate is in contact with the plurality of protrusions defining the recess of the stage body, and a contact surface between the first metal film and the second metal film is greater than a non-contact surface between the first metal film and the second metal film.

14. A substrate stage comprising:
a stage body having a substrate placing surface on which a substrate is placed in a processing apparatus that performs a processing on the substrate, the stage body including a base substrate, and an electrostatic chuck formed on the base substrate by thermal spraying a dielectric layer and an electrode layer for electrostatic adsorption to electrostatically adsorb the substrate, and
a thermocouple configured to detect a temperature near the substrate placing surface in the stage body,
wherein the thermocouple includes a temperature gauge formed by stacking a first metal film and a second metal film on a surface on a side of the substrate placing surface of the stage body,
the stage body includes a plurality of protrusions defining a recess of the stage body,
the temperature gauge is disposed between the plurality of protrusions in the recess of the stage body,
the first metal film is in contact with a bottom surface of the recess of the stage body,
an upper surface of the second metal film on the first metal film is disposed lower than an upper surface of the plurality of protrusions defining the recess of the stage body thereby providing a space between the upper surface of the second metal film and the substrate when the substrate is disposed on the substrate placing surface, and
a contact surface between the substate and the plurality of protrusions is larger than a non-contact surface between the substate and the plurality of protrusions in a plan view when the substrate is disposed on the substrate placing surface.

15. The substrate stage according to claim 14, wherein the first metal film and the second metal film are formed by thermal spraying.

16. The substrate stage according to claim 14, wherein the electrostatic chuck further includes a heater layer formed therein by thermal spraying, and the substrate stage controls the heater layer based on a detection signal of the thermocouple.

17. The substrate stage according to claim 14, wherein a compensating lead wire connected to the first metal film and the second metal film of the thermocouple is formed in the electrostatic chuck by thermal spraying.

18. The substrate stage according to claim 14, wherein the plurality of protrusions is formed on a portion of a surface of the electrostatic chuck except the temperature gauge, and surfaces of the protrusions serve as the substrate placing surface.

19. The substrate stage according to claim 18, wherein the surface of the temperature gauge is covered with another insulating film.

20. The substrate stage according to claim 14, wherein the temperature gauge is surrounded by the electrostatic chuck of the stage body and the substrate.

* * * * *